United States Patent

Shufflebotham et al.

[11] Patent Number: 6,106,678
[45] Date of Patent: Aug. 22, 2000

[54] METHOD OF HIGH DENSITY PLASMA CVD GAP-FILLING

[75] Inventors: Paul Kevin Shufflebotham; Mark Weise, both of San Jose, Calif.

[73] Assignee: Lam Research Corporation, Fremont, Calif.

[21] Appl. No.: 09/083,133

[22] Filed: May 22, 1998

Related U.S. Application Data

[63] Continuation of application No. 08/623,825, Mar. 29, 1996, abandoned.

[51] Int. Cl.[7] .................................................. C23C 14/34
[52] U.S. Cl. .............................. 204/192.32; 204/192.3; 204/192.37; 204/298.09; 204/298.15; 427/574; 427/579
[58] Field of Search .................... 204/192.3, 192.32, 204/192.23, 192.25, 192.37, 298.15, 298.07, 298.09; 427/569, 574, 579

[56] References Cited

U.S. PATENT DOCUMENTS

| | | | |
|---|---|---|---|
| 4,698,128 | 10/1987 | Berglund et al. | 438/701 |
| 5,089,442 | 2/1992 | Olmer | 438/631 |
| 5,279,865 | 1/1994 | Chebi et al. | 427/574 |
| 5,416,048 | 5/1995 | Blalock et al. | 438/631 |
| 5,571,576 | 11/1996 | Qian et al. | 427/574 |
| 5,660,740 | 8/1997 | Komino | 216/67 |

*Primary Examiner*—Nam Nguyen
*Assistant Examiner*—Julian A. Mercado
*Attorney, Agent, or Firm*—Burns, Doane, Swecker & Mathis, L.L.P.

[57] ABSTRACT

A gap filling process of depositing a film of $SiO_2$ in gaps on a substrate by generating plasma in a process chamber by energizing gas containing silicon, oxygen and a heavy noble gas such as xenon or krypton. The gaps can have widths below 0.5 $\mu$m and aspect ratios higher than 1.5:1. A substrate is supported on a substrate support wherein a gas passage supplies a temperature control gas into a space between opposed surfaces of the substrate and the substrate support, and the film is grown in the gaps on the substrate by contacting the substrate with the plasma. The silicon reactant can be $SiH_4$ and the oxygen reactant can be pure oxygen gas supplied by $O_2/SiH_4$ ratio of $\leq 1.05$. The plasma can be a high density plasma produced in an ECR or TCP reactor and the substrate can be a silicon wafer including aluminum conductor lines.

16 Claims, 6 Drawing Sheets

METHOD OF HIGH DENSITY PLASMA CVD GAP-FILLING

This application is a continuation of application Ser. No. 08/623,825, filed Mar. 29, 1996, abandoned.

FIELD OF THE INVENTION

The present invention relates to an improved method for high-density plasma deposition of silicon dioxide into high ratio gaps on semiconductor substrates such as silicon wafers having metal interconnection layers.

DESCRIPTION OF THE RELATED ART

CVD apparatus is conventionally used to form various thin films in a semiconductor integrated circuit. Such CVD apparatus can form thin films such as $SiO_2$, $Si_3N_4$, Si or the like with high purity and high quality. In the reaction process of forming a thin film, a reaction vessel in which semiconductor substrates are arranged can be heated to a high temperature condition of 500 to 1000° C. Raw material to be deposited can be supplied through the vessel in the form of gaseous constituents so that gaseous molecules are thermally dissociated and combined in the gas and on a surface of the substrates so as to form a thin film.

A plasma-enhanced CVD apparatus utilizes a plasma reaction to create a reaction similar to that of the above-described CVD apparatus, but at a relatively low temperature in order to form a thin film. The plasma CVD apparatus includes a process chamber consisting of a plasma generating chamber which may be separate from or part of a reaction chamber, a gas introduction system, and an exhaust system. For example, such plasma-enhanced CVD apparati are disclosed in U.S. Pat. Nos. 4,401,504; 5,279,865; 5,346,578; 5,405,480 and European Patent Application No. 94305090.6. Plasma is generated in such apparati by various plasma sources. A substrate support is provided in the reaction chamber which may include a radiofrequency (RF) biasing component to apply an RF bias to the substrate and a cooling mechanism in order to prevent a rise in temperature of the substrate due to the plasma action.

Vacuum processing chambers are generally used for chemical vapor depositing (CVD) of materials on substrates by supplying deposition gas to the vacuum chamber and application of an RF field to the gas. Examples of parallel plate, transformer coupled plasma (TCP), and electron-cyclotron resonance (ECR) reactors are disclosed in commonly owned U.S. Pat. Nos. 4,340,462; 4,948,458; and 5,200,232. The substrates are held in place within the vacuum chamber during processing by substrate holders. Conventional substrate holders include mechanical clamps and electrostatic clamps (ESC). Examples of mechanical clamps and ESC substrate holders are provided in commonly owned U.S. Pat. No. 5,262,029 and commonly owned U.S. application Ser. No. 08/401,524 filed on Mar. 10, 1995. Substrate holders in the form of an electrode can supply radiofrequency (RF) power into the chamber, as disclosed in U.S. Pat. No. 4,579,618.

Plasma enhanced chemical vapor deposition (PECVD) has been used for depositing intermetal dielectric layers at low temperatures in integrated circuit applications. A publication by M. Gross et al entitled "Silicon dioxide trench filling process in a radio-frequency hollow cathode reactor", J. Vac. Sci. Technol. B 11(2), March/April 1993, describes a process for void-free silicon dioxide filling of trenches using a hollow cathode reactor wherein silane gas is fed through a top target which supports a low frequency (1 MHz), low pressure (~0.2 Pa) oxygen and xenon discharge. In this process, high ion bombardment and a low rate of gas phase reaction produce an ion induced reaction with surface adsorbates, leading to directional oxide film growth whereby trenches with one micron openings and aspect ratios up to 2.5:1 are filled at rates over 400 A/min.

A publication by P. Shufflebotham et al. entitled "Biased Electron Cyclotron Resonance Chemical-Vapor Deposition of Silicon Dioxide Inter-Metal Dielectric Thin Films," Materials Science Forum Vol. 140–142 (1993) describes a low-temperature single step gap-filled process for use in inter-metal dielectric (IMD) applications on wafers up to 200 mm in diameter wherein sub-0.5 micron high aspect ratio gaps are filled with $SiO_2$ utilizing an $O_2$—Ar—$SiH_4$ gas mixture in a biased electron cyclotron resonance plasma-enhances chemical-vapor deposition (ECR-CVD) system. That single step process replaced sequential gap-filling and planarization steps wherein CVD $SiO_2$ was subjected to plasma etch-back steps, such technique being unsuitable for gap widths below 0.5 microns and aspect ratios (gap height:width) above 1.5:1.

SUMMARY OF THE INVENTION

The present invention provides a plasma process for providing $SiO_x$ filled gaps between electrically conductive lines on a semiconductor substrate comprising the steps of: providing a substrate in a process chamber of a plasma reactor; simultaneously introducing a silicon-containing reactant, a heavy noble gas and a oxygen-containing reactant into the process chamber; growing a $SiO_x$ film on the substrate by decomposing the silicon reactant and plasma phase reacting the decomposed gas on a surface of the substrate, the $SiO_x$ film being deposited in gaps between electrically conductive lines on the substrate wherein the gaps have widths below 0.5 μm and aspect ratios of gap height to gap width of at least 1.5:1; and sputtering film deposits on sidewalls of the gaps during the film growing step, the sputtering preventing void formation in the $SiO_x$ filled gaps.

According to a preferred embodiment, the heavy noble gas is xenon, the silicon reactant comprises $SiH_4$ and oxygen reactant comprises pure $O_2$. The $O_2/SiH_4$ ratio preferably is $\leq 1.05$. The plasma reactor is preferably a high-density plasma reactor and the film growing and sputtering steps are performed in a vacuum environment. The vacuum is preferably below 100 mTorr and the substrate is preferably maintained at a temperature below about 450° C. For instance, the film growing and sputtering steps can be carried out in a reaction chamber of a plasma enhanced chemical vapor deposition apparatus wherein RF biasing is applied to the substrate. The film growing step is characterized by an etch-to-deposition ratio of 0.2 to 0.6, preferably 0.3 to 0.4, the etch-to-deposition ratio being defined by a deposition rate without RF biasing minus the deposition ratio rate with RF biasing divided by the deposition rate with RF biasing. Prior to the filling of the gaps, polymer in the gaps can be removed by an oxygen plasma cleaning step.

The film can be deposited on a silicon wafer wherein the gaps are between aluminum conductor lines and the deposited film can have a substantially uniform refractive index in the range of 1.47 to 1.49 from edge to center of the substrate. The substrate can be supported on a substrate holder having an electrode supplying a radio-frequency bias to the substrate, the radio-frequency bias being generated by supplying the electrode with at least 2 Watts/cm². The substrate support can include a heating element and/or cooling mechanism providing closed-loop temperature control of the substrate. For example, a heat transfer gas can be supplied between a lower surface of the substrate and an upper surface of a substrate support on which the substrate is supported. For instance, helium gas can be supplied to a space between a lower surface of the substrate and an upper surface of the chuck. The reaction chamber can be part of an ECR reactor, TCP reactor, parallel plate reactor or other high density plasma system, such as a helicon, helical resonator, ICP, or HDP system and the substrate can be supported on an electrostatic or mechanical chuck.

BRIEF DESCRIPTION OF THE DRAWINGS

The invention will be described in greater detail with reference to the accompanying drawings in which like elements bear like reference numerals, and wherein.

DETAILED DESCRIPTION OF THE PREFERRED EMBODIMENTS

A high-density gap filling process according to the present invention may be carried out in a vacuum processing chamber wherein a processing gas is supplied by suitable apparatus such as gas distribution rings, showerhead electrode, etc. to the processing chamber and a vacuum is maintained in the interior of the chamber by suitable vacuum pump apparatus. The vacuum processing chamber can be supplied RF power through an external coil outside the chamber. However, the reactor can be of any other type of plasma reactor such as that of an ECR reactor, parallel plate reactor, helicon reactor, etc.

A substrate to be processed according to the present invention is mounted within the chamber by a suitable mounting apparatus such as a mechanical or electrostatic clamp (ESC). In the case of an electrostatic clamp, the electrostatic clamp can be a bipolar or monopolar ESC preferably containing water cooling channels for substrate temperature control.

Figure 1:
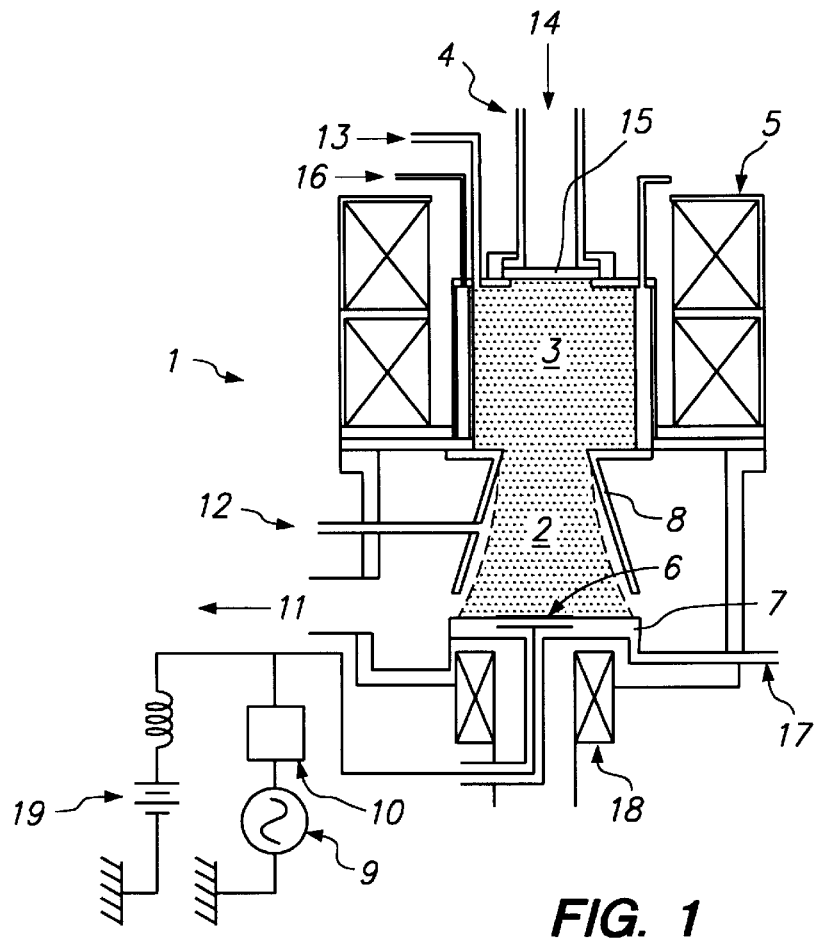
FIG. 1 is a schematic view of a high density plasma ECR reactor which can be used to carry out the process according to the invention.

FIG. 1 shows an ECR reactor 1 which can process a substrate with a high density plasma The reactor includes a reaction chamber 2 wherein a substrate is subjected to treatment with a plasma gas. In order to generate the high density plasma, the reactor includes a plasma generating chamber 3 wherein a high density plasma is generated by the combination of microwave energy transmitted through microwave guide 4 and magnetic energy generated by electromagnetic coils 5. The high density plasma can be generated from a suitable gas or gas mixture such as oxygen and/or argon. A substrate 6 is supported on a substrate support 7 such as an electrostatic chuck.

The high density plasma generated in chamber 3 can be confined within horn 8 and directed to the substrate 6 by applying an RF bias to the substrate by means of an RF source 9 and associated circuitry 10 for impedance matching, etc. The reaction chamber 2 is evacuated by a suitable vacuum arrangement represented generally by the evacuation port 11. In order to introduce one or more reactants into the high density plasma, the horn 8 can include one or more gas injection arrangements such as gas distributing rings on the inner periphery thereof whereby reactants such as $SiH_4$ and $SiF_4$ can be introduced into the high density plasma. The reactant or reactants can be supplied through one or more passages represented generally at 12. In order to produce a plasma in plasma generating chamber 3, oxygen and argon can be introduced into the plasma generating chamber 3 by one or more passages represented generally at 13.

Microwave energy represented by arrow 14 travels through dielectric window 15 and enters the plasma generating chamber 3, the walls of which are water cooled by water supply conduit 17. Electromagnetic coils 18 below substrate holder 7 are used for shaping the magnetic field in the vicinity of the substrate 6. A DC power source 19 provides power to the substrate holder 7 for electrostatically clamping substrate 6.

Figure 2:
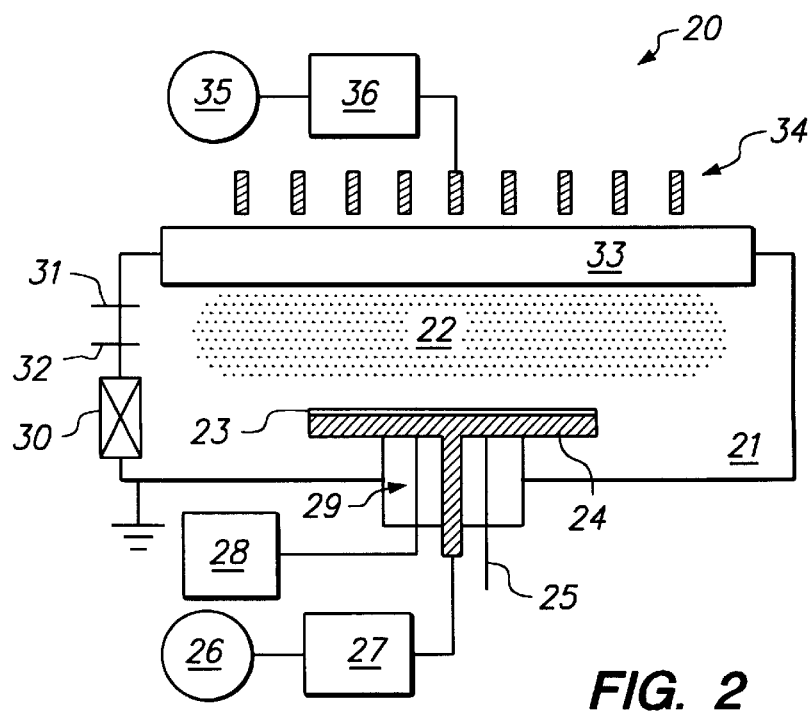
FIG. 2 is a schematic of a high density plasma TCP reactor which can be used to carry out the process according to the invention.

FIG. 2 shows a TCP reactor 20 which can process substrates with high density plasma. The reactor includes a process chamber 21 in which plasma 22 is generated adjacent substrate 23. The substrate is supported on water cooled substrate support 24 and temperature control of the substrate is achieved by supplying helium gas through conduit 25 to a space between the substrate and the substrate support. The substrate support can comprise an aluminum electrode or a ceramic material having a buried electrode therein, the electrode being powered by an RF source 26 and associated circuitry 27 for providing RF matching, etc. The temperature of the substrate during processing thereof is monitored by temperature monitoring equipment 28 attached to temperature probe 29.

In order to provide a vacuum in chamber 21, a turbo pump is connected to outlet port 30 and a pressure control valve can be used to maintain the desired vacuum pressure. Reactants such as an oxygen-containing reactant (e.g., oxygen) and a silicon-containing reactant (e.g., silane) can be supplied into the chamber by conduits 31, 32 which feed the reactant gases to a gas distribution ring extending around the underside of dielectric window 33 or the reactants can be supplied through a dielectric showerhead window. A TCP coil 34 located outside the chamber in the vicinity of the window is supplied RF power by RF source 35 and associated circuitry 36 for impedance matching, etc. When a substrate is processed in the chamber, the RF source 35 supplies the TCP coil 34 with RF current at 13.56 MHz and the RF source 26 supplies the lower electrode with RF current at 400 kHz.

Plasma reactors such as ECR and TCP reactors 1, 20 can be used to carry out the gap filling process of the invention wherein a heavy noble gas heavier than Argon is used to increase the etch-to-deposition ration (EDR) for void-free filling of sub 0.5 μm high aspect ratio gaps. The heavy noble gas is effective in sputtering corners of sidewalls of the gaps such that the corners are facetted at an angle of about 45 degrees. The noble gas has a low ionization potential and forms massive ions which enhance the sputtering rate at a given RF power relative to the deposition rate, thus reducing the power required to fill a given gap structure. Moreover, the low ionization potential of the noble gas helps spread plasma generation and ion bombardment more uniformly across the substrate. As xenon is the heaviest of the non-reactive noble gasses, xenon is preferred as the noble gas. Krypton can also be used even though it has a lower mass and higher ionization potential than xenon. If, however, the noble gas is omitted in the gap filling process, very large amounts of energy are required to achieve the desired EDR.

Figure 3:
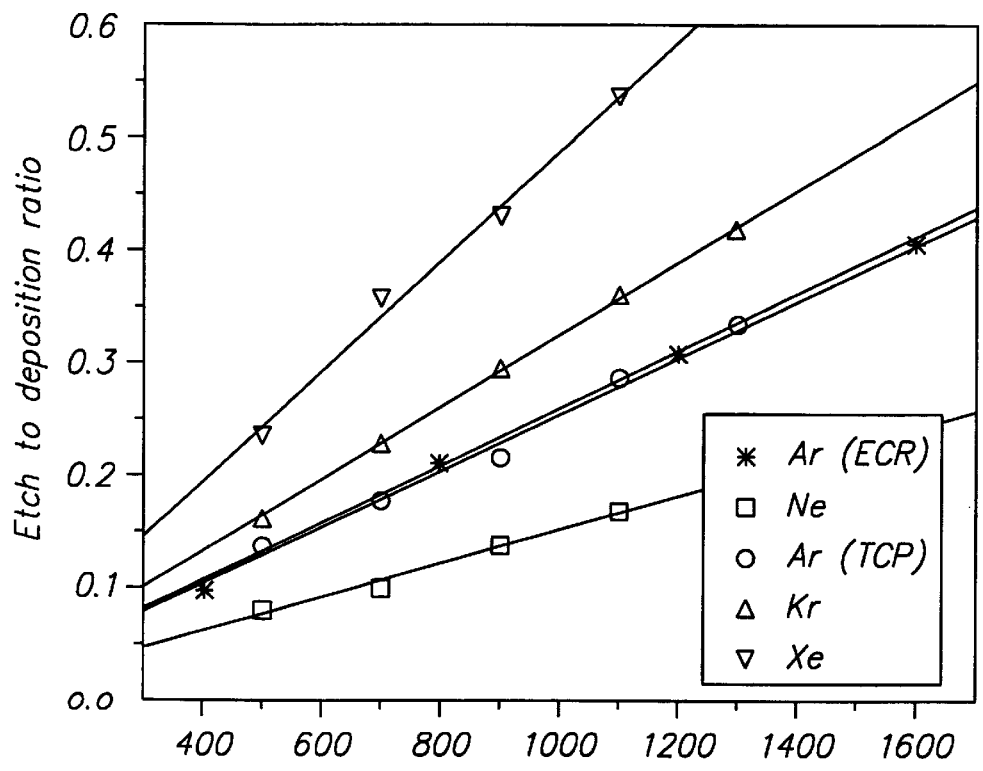
FIG. 3 is a graph of etch-to-deposition ratio (EDR) versus RF bias power in Watts.
Figure 4:
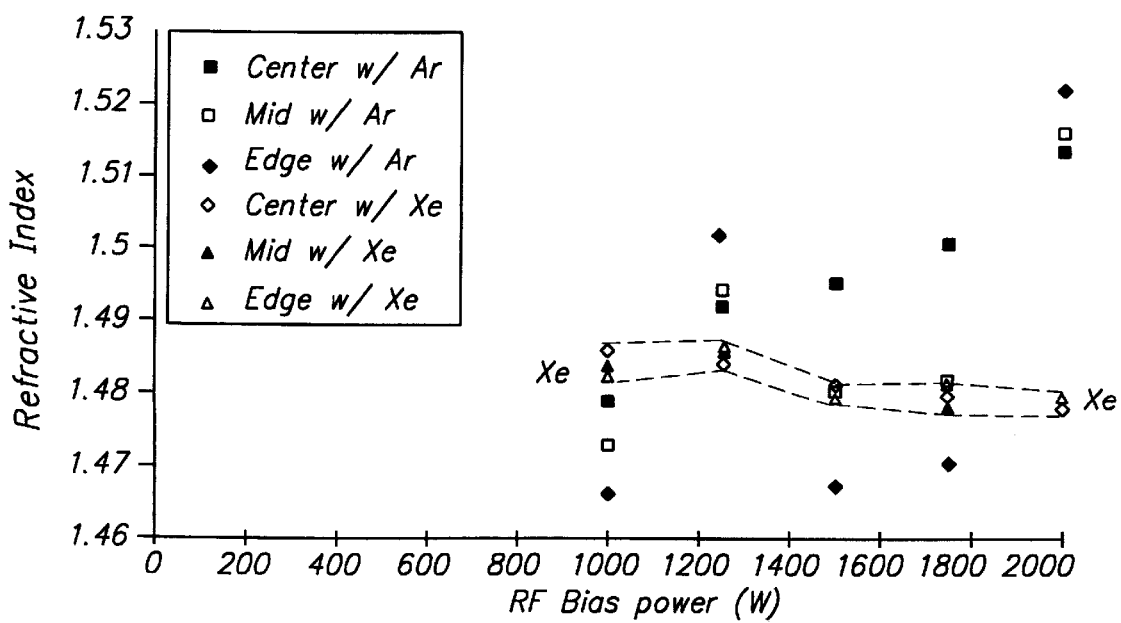
FIG. 4 is a graph of refractive index versus RF bias power.

In carrying out the process in a TCP-CVD reactor, the chamber can be maintained at a vacuum pressure of less than 100 mTorr and the flow rates of the reactant gases can be 10 to 200 sccm oxygen, 10 to 200 sccm silane and 10 to 200 sccm heavy noble gas. The TCP power can range from 200 to 2000 Watts, and the RF bias power applied to the bottom electrode can range from 0 to 2000 Watts. The helium can be supplied at a pressure of 1 to 10 Torr to maintain the substrate temperature at 50 to 300° C. The ability to perform gap filling is characterized by the EDR. As shown in FIG. 3, a graph of EDR versus RF bias power, in the process according to the invention, the sputtering efficiency of xenon is much higher than the sputtering efficiency of argon. In FIG. 4, a graph of refractive index versus RF bias power for films produced according to the invention, the center-to-edge variation in refractive index is much smaller when xenon is used than when only argon is used.

The process of the invention can also be carried out in an ECR-CVD reactor. For instance, a 200 mm silicon wafer can be processed in the ECR-CVD system shown in FIG. 1 as follows. Microwaves at 2.45 GHz are introduced into the chamber through a rectangular wave guide operating in the $TE_{10}$ mode. The chamber is encircled by a large electromagnet which produces a static, divergent axial magnetic field and produces ECR conditions while confining the plasma and forcing the plasma out into the reaction chamber. In the IMD process, $O_2$ is introduced into the plasma chamber so as to produce an intense, low energy ion beam which streams into the reaction chamber and onto the wafer. Heavy noble gases such as Xe and/or Kr can be added either to the plasma or reaction chamber gases in order to influence the characteristics of the film. Silane gas is injected through the reaction chamber gas ring and the reaction chamber is evacuated by a magnetically levitated turbomolecular pump through a pressure control throttle valve. Wafers are held on an electrostatic chuck provided with variable pressure backside He cooling and 13.56 MHz radio frequency bias capability. The wafer temperature is monitored using a fluoroscopic temperature sensor in contact with the backside of the wafer. Two concentric electromagnets situated behind the wafer plane control the magnetic field profile in the downstream region. One coil is operated in opposition to the main coil to form a "cusp" field configuration, while the other is operated in concert with the main coil to form a "mirror" field configuration. The position of the wafer holder assembly is adjustable from 20 to 25 cm from the plasma chamber aperture.

In the biased ECR-IMD process, deposition and sputtering occur simultaneously and good gap-filling performance is obtained by balancing the two phenomena during processing so that the gap is completely filled in the shortest possible time. As the growing film fills the gaps, sputtering prevents growth on the sidewalls from closing over the top of the gap, thereby preventing the formation of a void. In the process, microwave power is absorbed primarily by the plasma electrons which rapidly acquire high energies in the resonant microwave field. These electrons then undergo inelastic collisions with neutral gas molecules, causing excitation, dissociation and ionization. Increasing the microwave power increases the plasma generation rate, and thus the density of charged and non-equilibrium neutral species in the plasma chamber. Since this is a remote source, increasing the microwave power increases the flux of plasma species onto the wafer which in turn increases the deposition rate.

In order to contribute to film growth, the plasma must be transported through the reaction chamber onto the wafer. ECR plasmas are most efficient at low pressures, e.g, $10^{-4}$ to $10^{-2}$ Torr. At these pressures, charged particle dynamics are dominated by electromagnetic effects rather than collisions with atoms and molecules. The divergent axial magnetic field exerts an axial force on the charged particle species, forcing the plasma through the plasma chamber aperture into the reaction chamber. The plasma streams through the reaction chamber following the magnetic field lines, which map the plasma onto the wafer surface. In contrast, neutral species from the plasma chamber and from the reaction chamber gas ring diffuse throughout the reaction chamber under molecular flow conditions. It is believed that the $SiO_2$ deposition process is ion flux activated. While the actual species responsible for film growth have yet to be determined, the growth process clearly depends on the ion flux. The plasma stream has a sharply defined edge created by the plasma chamber aperture and the deposition rates on surfaces in contact with the plasma stream are on the order of 1000 to 10,000 Å/min, while the rates on areas not in contact with the plasma stream are one or two orders of magnitude lower. Increasing the mirror coil current concentrates the ion flux onto the wafer, which increases the deposition rate. Conversely, increasing the cusp coil current decreases the ion flux onto the wafer, which decreases the deposition rate. Since the transport of neutral species is unaffected by magnetic fields, the deposition rate appears to be proportional to the ion flux arriving on the wafer surface.

The ion-activated deposition process is beneficial for filling high aspect ratio gaps because it makes the deposition process inherently non-conformal. Since the ions arrive at normal incidence, deposition on sidewalls is much less than that on horizontal surfaces. This makes filling narrow or high aspect ratio gaps easier since the gap is less likely to prematurely close at the top. In the IMD process, the growing film is simultaneously sputtered by energetic ion bombardment. RF power applied to the chuck, which produces a net negative DC bias on the wafer surface, accelerates positive ions onto the wafer surface, which sputters the growing film. The sputtering rate is proportional to the ion energy, which increases with the magnitude of the RF bias. Therefore, increasing the RF power decreases the net deposition rate. The reason that simultaneous sputtering helps gap-filling is that the sputter yield depends on the ionic angle of incidence, with the maximum usually at 45°. For normally incident ions, sputtering will be most pronounced on the top corners of the lines, and will form 45° facets. Thus, the very features that would tend to close off the top of a gap during deposition are exactly those features which are sputtered most rapidly. Control over the ion dynamics is critical in the gap-fill process. The flux determines the deposition rate, while the energy determines the sputtering rate. These two parameters must be optimized to give complete gap-fill at the highest possible net deposition rate without adversely affecting other important film and process parameters. To quantify the relative effect of these competing processes, the etch-to-deposition ratio, EDR, is calculated from the deposition rates with and without RF bias according to:

$$EDR = \frac{DR(NO\ RF) - DR(RF)}{DR(RF)} \quad (1)$$

where DR refers to deposition rate. Processes with a high EDR will fill higher aspect ratio gaps than those having a lower EDR. Most deposition variables affect the deposition rate. Of particular importance is the oxygen to silane gas flow ratio, $O_2/SiH_4$. Decreasing the $O_2/SiH_4$ ratio increases the deposition rate. However, the $O_2/SiH_4$ ratio is not considered an appropriate parameter for controlling the EDR because of its impact on other important film properties.

Film stoichiometry determines many important film properties such as stress, OH content, refractive index, dielectric constant, breakdown voltage, density, etc. The film stoichiometry depends on the relative concentrations of oxygen ions and the adsorbed $SiH_x$ species responsible for film growth. In practice, the $O_2$ to $SiH_4$ gas flow ratio is the most direct external control of this ratio. For instance, as the $O_2/SiH_4$ ratio increases, OH content increases and refractive index decreases. The optimum reaction for stoichiometric $SiO_2$ is represented by the reaction $O_2+SiH_4 \rightarrow SiO_2+2H_2$, which results in minimal Si—OH and Si—H incorporation in the film. Lowering the $O_2/SiH_4$ ratio below unity starves the reaction of oxygen, and excess silicon begins to appear in the oxide. Wafer temperature can also affect properties normally controlled through the film stoichiometry. For instance, reduced stress can be obtained at lower wafer temperatures.

According to an example, a 200 mm wafer processed with the wafer temperature maintained at 260° C. or below achieved the following: gap-fill aspect ratio at a width of 0.25 μm of 3:1, thickness uniformity of ≤1.6%, deposition rate of 5300 Å/min, breakdown strength of ≧8 MV/cm, dielectric constant of 4.0±0.1, stress (compressive) of 100±50 MPa, refractive index at 6328 Å of 1.485±0.015, OH content of ≦0.5 atomic %, $H_2O$ content of below its detection limit and particulate density of ≦0.3 cm$^{-2}$.

The gap-fill process according to the invention can also be carried out with the apparatus shown in FIG. 2 as follows. The reaction chamber can comprise a short cylindrical vacuum chamber evacuated with a side mounted turbo molecular pump providing a pumping speed of approximately 550 liters/second. The $O_2$ and $SiH_4$ reactant gases can be introduced through separate gas rings located at the outer edge of the TCP window. Plasma can be generated using a TCP source consisting of a spiral coil operated at 13.56 MHz. Such TCP sources couple RF power into the plasma inductively through a dielectric window, generating a planar, high density plasma at low pressures. Wafers can be mechanically clamped at their outside edge onto an aluminum electrode located 10 cm from the TCP window. The temperature of the electrode can be maintained at 20° C. and wafer temperature control can be accomplished through the application of static He pressure to the backside of the wafer. A large DC sheath voltage above the surface of the wafer can be provided by supplying RF power to the electrode.

The use of TCP-CVD for depositing high-quality $SiO_2$ inter-metal dielectric (IMD) in sub-half micron, high aspect ratio gaps involves simultaneous deposition and sputtering of $SiO_2$. The resultant anisotropic deposition fills gaps from the bottom-up and the angular dependence of the sputtering yield also prevents the tops of the gaps from pinching off during deposition. Sputtering is produced through the application of a large RF bias to the wafer. The bias power determines the sheath voltage above the wafer essentially independently of plasma generation. High bias powers generate large sheath voltages, and thus energetic ion bombardment of the wafer surface. In absence of an RF bias, the film quality and gap-filling performance are poor due to a jagged appearance of the sidewall film suggesting that it is very porous and heavy deposits forming above metal lines shadow the trench bottoms from deposition and eventually pinch-off the gap, leaving a void.

Figure 5:
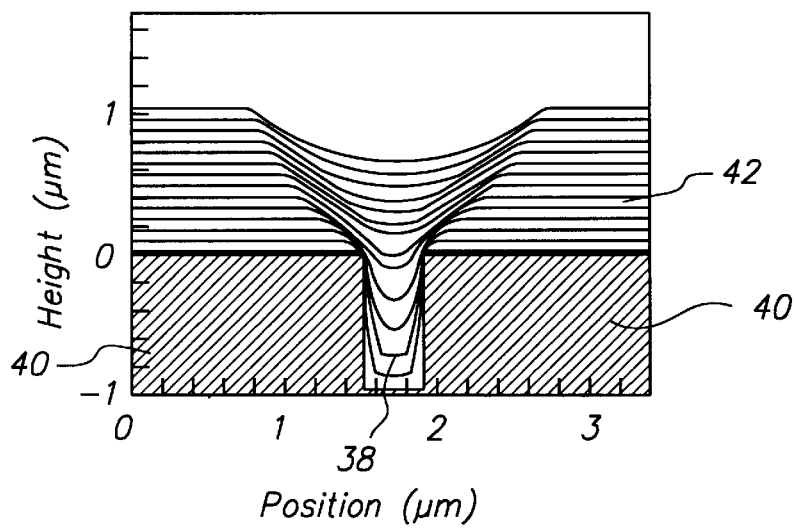
FIG. 5 shows an example of a deliberately layered gap filled structure.

FIG. 5 shows an illustration of a deliberately layered gap-fill process of $SiO_2$ in a gap 38 formed by Al lines 40 and wherein Si-rich layers 42 are produced by reducing the $O_2$ flow by 50% for 2 seconds 6 times during the deposition. As is clearly evident, the process results in very low sidewall deposition, bottom-up progression of the fill, and roughly 45° facets characteristic of sputtering. This tendency of the physical sputtering yield to maximize at 45° off normal is beneficial for sub 0.5 μm gap-filling because it prevents voids by preferentially removing the shoulders with minimal impact on the deposition rate on horizontal surfaces.

Figure 6:
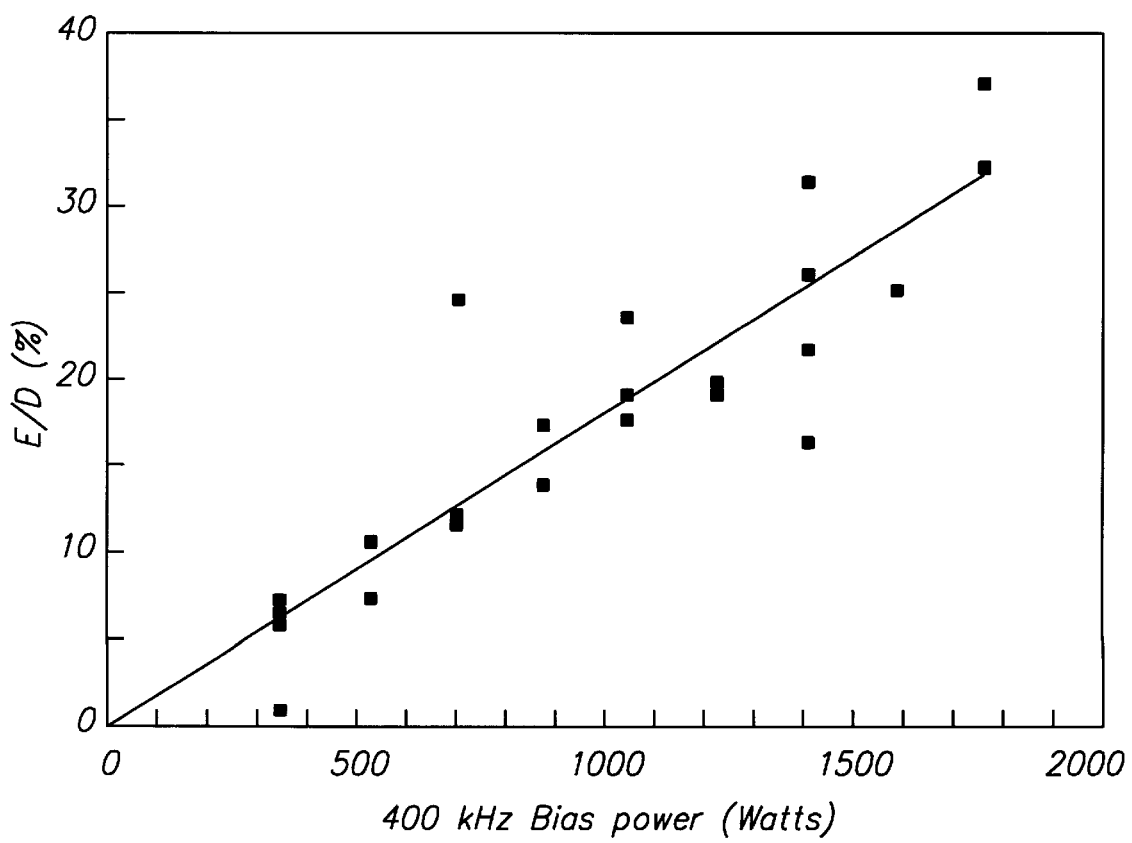
FIG. 6 shows the effect of 400 kHz RF bias power on etch to deposition ratio.

The effect of bias RF power on the sputter etch to deposition ratio EDR without addition of Xe is shown in FIG. 6 wherein EDR increases from 0 to about 30% as bias power increases from 0 to about 1800 Watts. It has been found that more aggressive gaps require higher EDR for successful filling and according to the invention, higher EDR can be obtained by partially replacing Ar with Xe.

FIG. 4 shows the effects on refractive index as RF bias power is varied from 1000 to 2000 Watts. As shown in FIG. 4, the edge-to-center variation in refractive index lies within a range of about 1.48 to about 1.49 when the argon is replaced with xenon whereas the refractive index varies widely from center to edge when argon is used instead of xenon. For instance, when the RF bias power is 1000 Watts, the refractive index varies from about 1.48 at the center to about 1.465 at the edge when using argon whereas the refractive index ranges from about 1.483 to about 1.486 from edge to center when the argon was replaced with xenon. When the RF bias power was about 1250 Watts, the refractive index varied from about 1.493 to about 1.53 from center to edge when using argon whereas the refractive index was around 1.485 to about 1.488 from center to edge when the argon was replaced with xenon. The results shown in FIG. 4 were obtained using TCP power at 850 Watts, the $SiH_4$ flow at 100 sccm, the $O_2$ at 135 sccm, the Ar/Xe flow at 100 sccm, the electrostatic chuck voltage at 750 volts, and the He backside cooling pressure at 5 mTorr. Improved gap filing can be obtained when the EDR is around 0.25 to 0:50, the ratio of $SiH_4$ to $O_2$ is around 1:1, Xe is substituted for Ar.

Electron cyclotron resonance plasma chemical vapor deposition (ECR-CVD) and transformer coupled plasma CVD (TCP-CVD) systems can be used to target the next generation intermetal dielectric (IMD) deposition market. TCP can generate a high density plasma (>1×10$^{11}$ ions/cm$^3$) and sustain it even at a very low pressure (<10 mTorr). The advantages of high density PECVD such as TCP-CVD include increased throughput, uniform ion and radical densities over large areas, and subsequent manufacturability of scaled-up reactors. When complemented with a separate RF biasing of the substrate electrode, TCP-CVD systems also allow independent control of ion bombardment energy and provide an additional degree of freedom to manipulate the plasma deposition process.

In the ECR-CVD or TCP systems, film growth occurs by an ion-activated reaction between oxygen species impinging onto the wafer from the plasma source and silane fragments adsorbed on the wafer. Using ECR/TCP-CVD, sub-0.5 µm, high aspect ratio gaps can be filled with superb quality $SiO_2$ dielectric on 8" diameter wafers. In essence, the ECR/TCP-CVD system provides a manufacturable intermetal dielectric CVD process that utilizes high density plasmas.

ECR/TCP-CVD ion bombardment plays a key role in the deposition process not only by the activation of surface reactions, but also by simultaneous sputtering that prevents premature closing of the trench top and formation of voids. Sputtering enables high aspect ratio features to be filled from the bottom up. The latter mechanism results in void-free filling of sub-0.5 µm features, a task very difficult to accomplish with TEOS and $TEOS/O_3$ based processes. With respect to the TCP-CVD system, the effects of changing the RF bias power (thus the ion bombardment energy) and using different noble gas diluents are discussed below.

The film thickness, refractive index, concentrations of Si—OH and Si—H, and macroscopic stress were measured after deposition. The oxide film thickness was measured at 81 spots on each test wafer using Prometrix, and the mean value was used to determine the net deposition rate. The refractive index was measured on the center, the middle, and the edge of each wafer using a Metricon PC-2000 prism coupler equipped with a model 200-P-1C prism. Transmission infrared spectrum of each sample was acquired using Bio-Rad SPC3200 FTIR spectrometer. Atomic concentration of Si—OH and absorbance of Si—H per film thickness were estimated from the infrared spectra. The absorbance peak height to atomic percentage calibration was available for Si—OH, but not for Si—H due to the inaccuracy in measuring low Si—H concentrations. From the known film thicknesses and the absorbance peak heights of infrared spectra, the absolute concentration of Si—OH and the relative concentration of Si—H were calculated. The equation for the Si—OH atomic concentration is as follows:

$$\text{Si—OH(atomic \%)} = \frac{\text{absorbance} \times 209.43}{\text{film thickness}(\mu m)} \quad (1)$$

Finally, macroscopic film stress was determined from the wafer curvature by 2-point laser deflection measurements using a Flexus 2-300.

Figure 7:
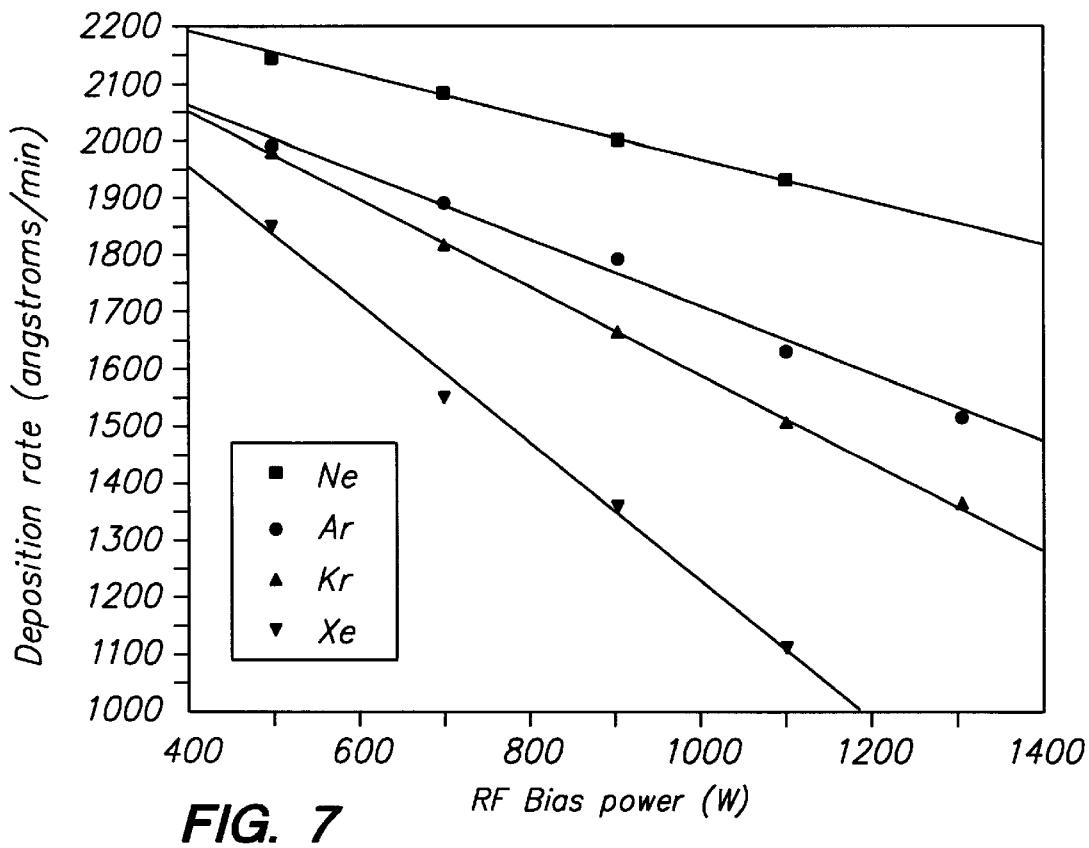
FIG. 7 is a graph of deposition rate in angstroms/min versus RF bias power in Watts.

FIG. 7 illustrates the net deposition rate as a function of RF bias power using different noble gas diluents. As expected from ECR-CVD experiments, the net deposition rate decreases with RF bias power (or ion energy), indicating that sputtering competes with deposition also in TCP-CVD. In other words, the rate of sputtering increases compared to the deposition rate as the RF bias increases. This result indicates that the TCP-CVD system can provide simultaneous deposition and sputtering making it possible to fill high aspect ratio gaps.

FIG. 7 also shows that heavier diluents such as Kr and Xe, in the presence of RF bias, exhibit much lower deposition rates than Ne and Ar despite the fact that they all have the same total kinetic energy after being accelerated by the sheath potential. Thus, the rate of sputtering depends not only on the total energy of the ions but also on their mass. This is consistent with the fact that sputtering is competing with deposition. FIG. 7 indicates that all four straight lines share nearly the same y-intercept (i.e., the deposition rate in the absence of RF bias and sputtering). In fact, the y-intercepts of the four straight lines fall within 5% of each other, and the average value of the four y-intercepts is 2355 Å/min. Hereafter, the deposition rate in the presence of RF bias will be referred to as the net deposition rate. The net deposition rate, $R_{ND}$, is the difference between the deposition rate, $R_D$, and the sputtering rate, $R_S$:

$$R_{ND} = R_D - R_S \quad (2)$$

Figure 8:
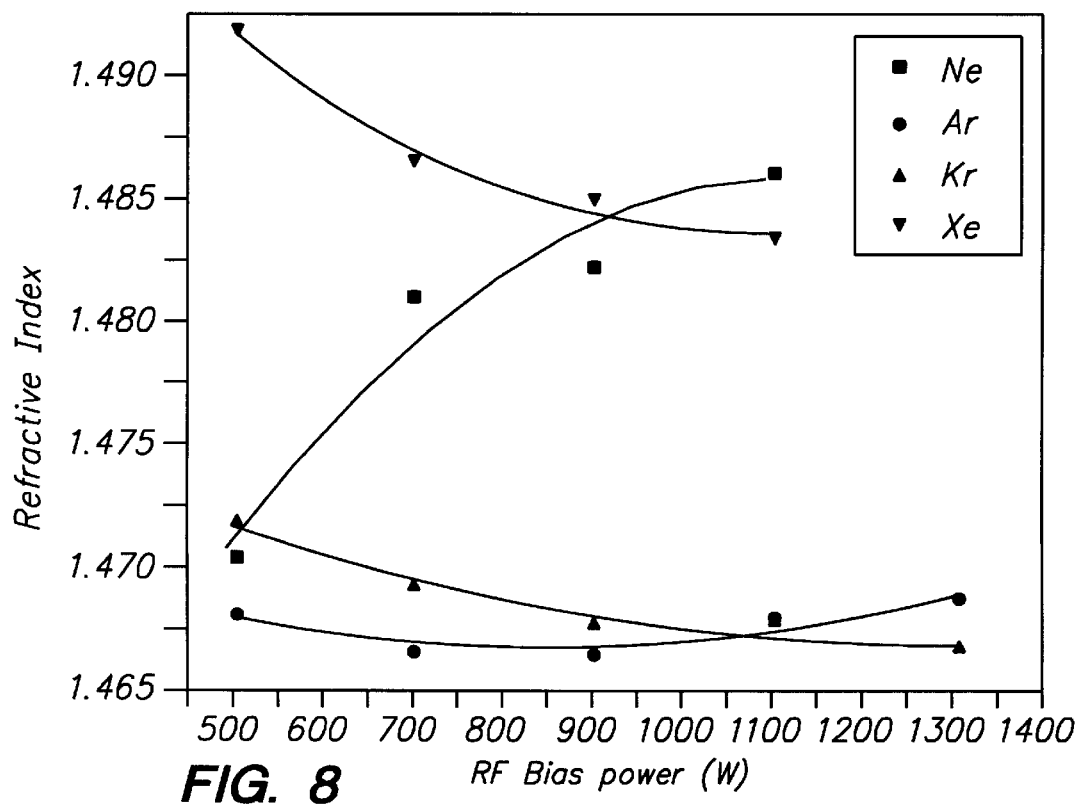
FIG. 8 is a graph of refractive index of the deposited film versus RF bias power in Watts.

The fact that all the curves emanate from the same point in FIG. 8 suggests that the deposition rate, $R_D$, and deposition mechanism are not a strong function of noble gas diluent and that to a first approximation the role of the noble gas is to supply the ions for sputtering.

To quantify the relative effects of deposition and sputtering, the etch to deposition ratio (EDR) is plotted as a function of RF bias, wherein EDR is defined as:

$$EDR = \frac{(R_{D0} - R_{ND})}{R_{D0}} = \frac{R_S}{R_{D0}} \quad (3)$$

where $R_{D0}$ is the deposition rate in the absence of RF bias.

The film refractive index as a function of RF bias for different noble gas diluents is shown in FIG. 8. Assuming that a refractive index higher than that of stoichiometric oxide indicates a Si-rich film, Xe and Ne created a Si-rich oxide film whereas Ar and Kr produced a film whose refractive index is close to that of a thermal oxide ($n_{ox}$= 1.46). The refractive index of the films deposited using Ar and Kr were relatively insensitive to the changes in RF bias. In contrast, the refractive index for Ne increased substantially as RF bias increased, suggesting that the film became progressively Si-rich as RF-bias increased.

Figure 9:
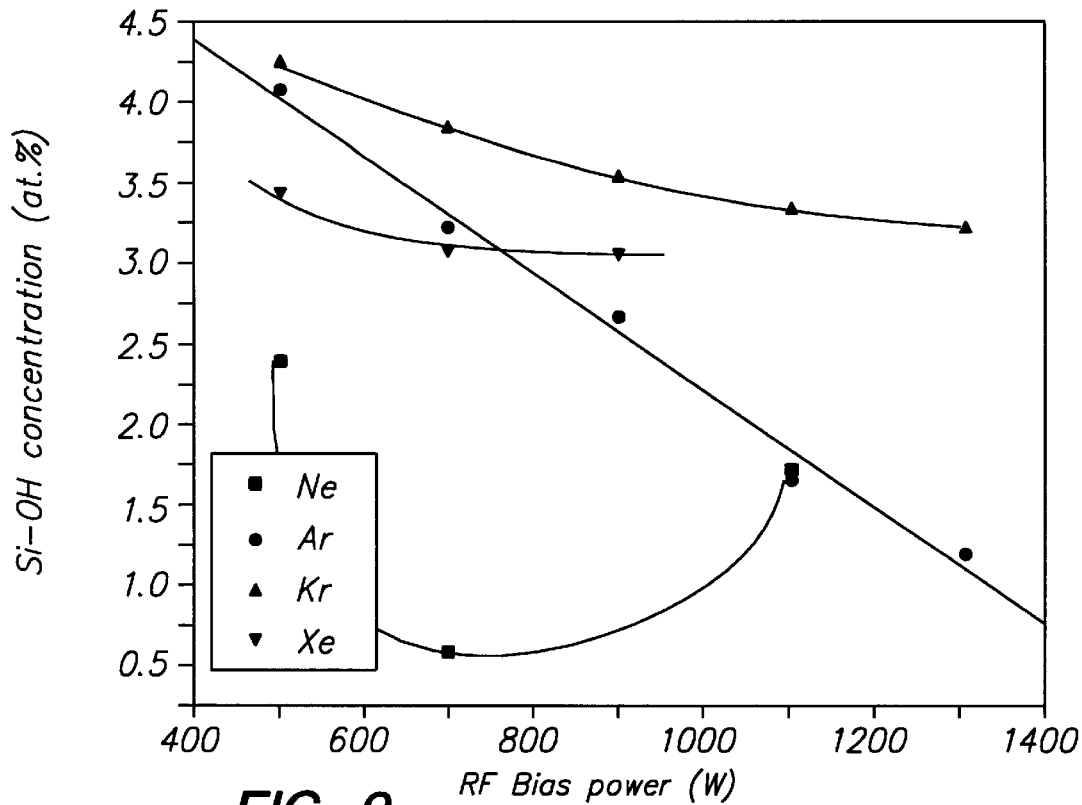
FIG. 9 is a graph of Si—OH concentration in atomic % versus RF bias power.

The transmission FTIR spectra of the oxide films revealed that Si—OH concentration decreases with increasing RF bias (FIG. 9). The Si—H concentration, independent of RF bias, remained nearly constant for Kr and Xe at ~0.0005 $\mu m^{-1}$.

Figure 10:
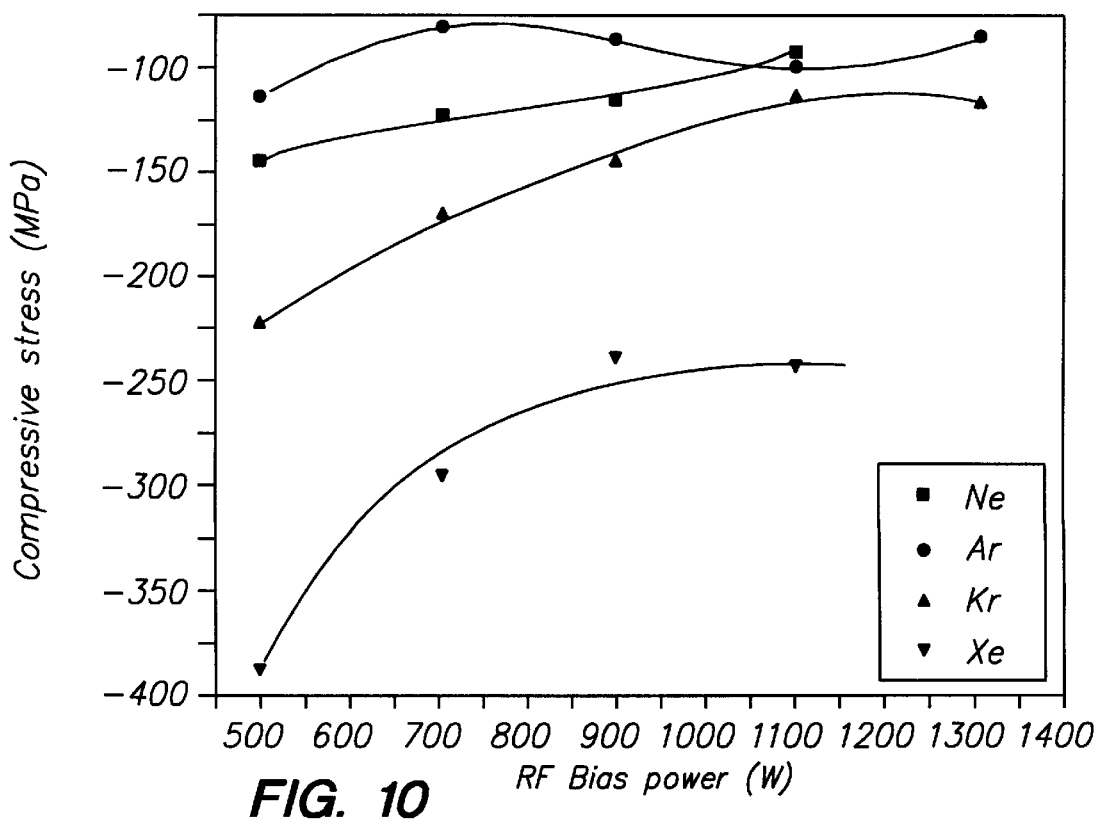
FIG. 10 is a graph of compressive stress in MPa versus RF bias power in Watts.

For all noble gases, the macroscopic film stress became less compressive as RF bias increased and eventually plateaued above 1100 Watts of RF bias. The film response to RF bias was more pronounced for heavier species such as Kr and Xe than the lighter ones. Moreover, the heavier ions seemed to create more compressive films than their counterparts (FIG. 10).

Assuming that the sputtering rate is given by:

$$R_s = \frac{YJ_+}{\rho} \quad (4)$$

where Y, $J_+$, and ρ are sputtering yield, ion flux, and oxide density, respectively, the sputtering yield can be taken to be proportional to the square root of the ion bombardment energy, E, when E is below 500 eV. The sputtering yield is given by $$Y = A(\sqrt{E} - \sqrt{E_{th}}) \quad (5)$$

where A is a proportionality constant and $E_{th}$ is the threshold energy. For $SiO_2$ sputtering with $Ar^+$, A=0.0337 $eV^{-\frac{1}{2}}$, and $E_{th}$=18 eV. The square root energy dependence is expected based on the assumption that the sputtering rate scales linearly with the momentum of incoming ions. If the sputtering rate depends on the momentum of the ions then the constant A is proportional to the square root of the atomic mass number (M) of the ions:

$$A = \beta\sqrt{M} \quad (6)$$

where β is 5.328×10⁻³ $(eV\ amu)^{-\frac{1}{2}}$. Assuming that the ion energy scales linearly with the RF bias:

$$E = \alpha P_{RF} \quad (7)$$

where α and $P_{RF}$ are a proportionality constant and the RF bias power, respectively, the net deposition rate can be written as:

$$R_{ND} = R_D - \frac{\beta J_+}{\rho}(\sqrt{\alpha M P_{RF}} - \sqrt{ME_{th}}) \quad (8)$$

Figure 11:
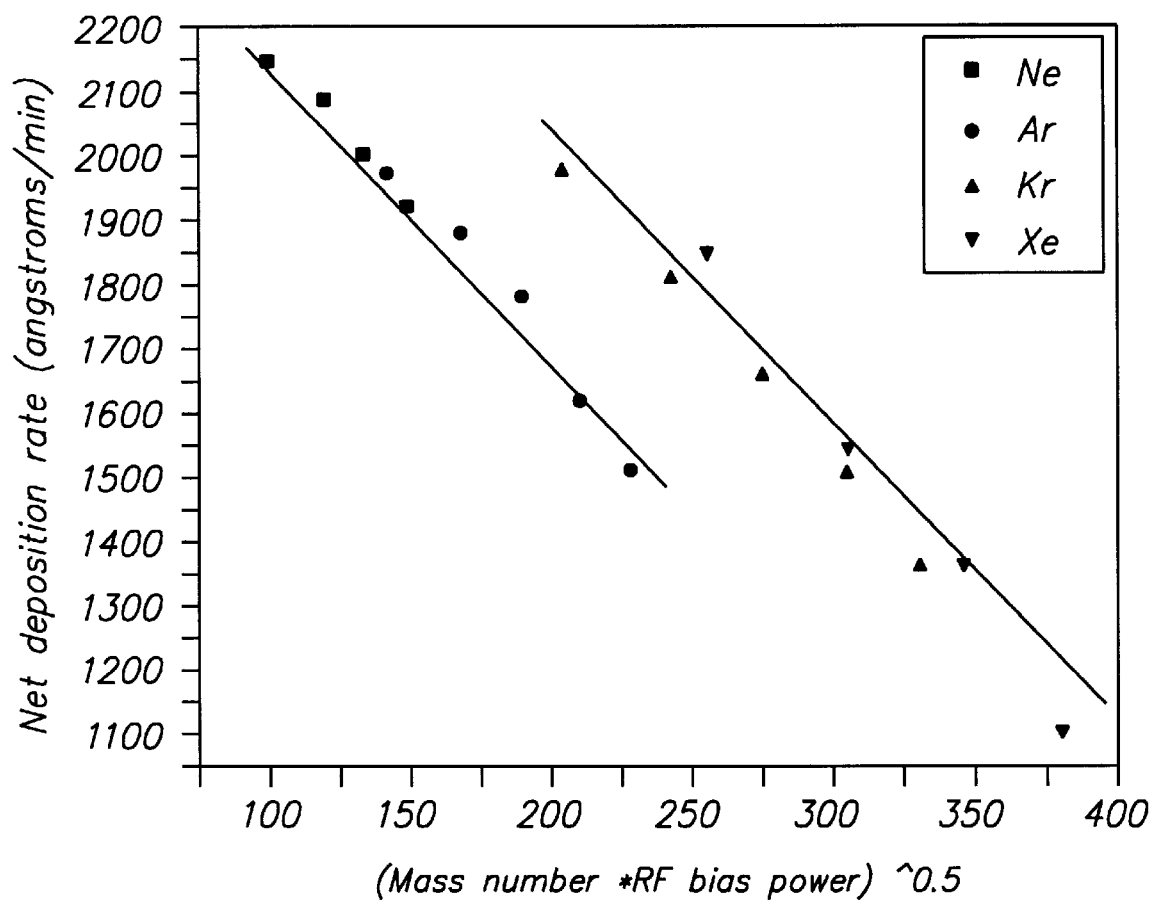
FIG. 11 is a graph of net deposition rate in angstroms/min versus atomic mass number and RF bias power.

Thus, a plot of the deposition rate versus $(M \times P_{RF})^{1/2}$ must yield straight lines with similar slopes and slightly different y-intercepts. In fact, if the ion flux, $J_+$, is relatively independent of the noble gas diluent, identical slopes slightly different intercepts would be expected. FIG. 11 shows net deposition rates versus $(M \times P_{RF})^{1/2}$ for different noble gas diluents. The data for Ne and Ar collapse into one straight line while the data for Kr and Xe collapse into another straight line with identical slopes but with slightly different intercepts. Since the data was taken for a limited range of RF bias power, it appears that the sputtering rate either scales linearly with the ion energy or with 0.5 power of the ion energy. The square root dependence of $R_s$, and thus that of EDR on ion mass is evident from the above analysis.

A combination of deposition and sputtering makes it possible to fill high aspect ratio gaps and that the momentum of impinging ions is a governing factor in the sputtering process. Since heavier noble gas diluents allow a much more flexible control over sputtering, Ar can be partially or totally replaced by Kr or Xe. For example, the etch-to-deposition ratio can be raised by resorting to a heavier diluent while holding the RF bias constant (see FIG. 3). These alternative choices could also prevent severe radiation damages often caused by applying a high RF bias to increase the ion bombardment energy. The only apparent disadvantage of using heavier noble gas diluents is their cost. Xe, for instance, costs approximately ten times more than Ar.

In summary, the sputtering rate increases with increasing mass of the noble gas diluent. For example, the sputtering rate with Xe diluent is higher than the sputtering rate with Kr diluent, which in turn is higher than that of Ar and Ne. Therefore, a much higher EDR can be achieved with the same RF bias by using heavier noble gas diluents. Further, noble gas atoms with larger collisional cross sections can provide more electrons under the same condition and increase the $O_2$ dissociation rate, supplying more O radicals that reach the surface to form Si—OH. Thus, bulkier atoms such as Kr and Xe form a much more compressive film than Ne and Ar by incorporating more Si—OH into the film. The increase in Si—OH film concentration was generally complemented by a decrease in Si—H concentration.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A plasma process for providing $SiO_x$ filled gaps between electrically conductive lines on a semiconductor substrate comprising steps of:
    providing a substrate in a process chamber of a plasma reactor;
    simultaneously introducing a silicon-containing reactant, a noble gas selected from the group consisting of xenon, krypton or mixture thereof, and an oxygen-containing reactant into the process chamber;
    growing a $SiO_x$ film on the substrate by plasma phase reacting the silicon containing reactant on a surface of the substrate, the $SiO_x$ film being deposited in gaps between electrically conductive lines on the substrate wherein the gaps have widths below 0.5 µm and aspect ratios of gap height to gap width of at least 1.5:1, the silicon containing reactant comprising $SiH_4$ and the oxygen containing reactant comprising $O_2$, the $O_2$ being supplied in a ratio of $O_2/SiH_4$ of $\leq 1.05$ and the deposited film having a substantially uniform refractive index in the range of 1.47 to 1.49; and
    sputtering film deposits on sidewalls of the gaps during the film growing step by applying an RF bias to the substrate, the sputtering facetting corners of the gaps and preventing void formation in the $SiO_x$ filled gaps.

2. The process of claim 1, wherein the plasma reactor is a high-density plasma reactor.

3. The process of claim 1, wherein the film growing and sputtering steps are performed in a vacuum environment.

4. The process of claim 3, wherein the vacuum is below 100 mTorr and the substrate is maintained at a temperature below about 450° C.

5. The process of claim 1, wherein the film growing and sputtering steps are carried out in a reaction chamber of a plasma enhanced chemical vapor deposition apparatus and RF biasing is applied to the substrate.

6. The process of claim 5, wherein the film growing step is characterized by an etch-to-deposition ratio of 0.2 to 0.6, the etch-to-deposition ratio being defined by deposition rate without RF biasing applied to the substrate minus a deposition rate with the RF biasing applied to the substrate divided by the deposition rate with RF biasing applied to the substrate.

7. The process of claim 6, wherein the etch-to-deposition ratio is 0.3 to 0.4.

8. The process of claim 1, further comprising introducing argon into the process chamber during the film growing and sputtering steps.

9. The process of claim 1, wherein the film is deposited on a silicon wafer wherein the gaps are between aluminum conductor lines.

10. The process of claim 1, further comprising applying an RF bias to the substrate by supporting the substrate on a substrate holder having an electrode supplying a radio-frequency bias to the substrate, the radio-frequency bias being generated by supplying the electrode with at least 2 Watts/cm² of power.

11. The process of claim 1, further comprising controlling heating of the substrate by supplying a heat transfer gas between a lower surface of the substrate and an upper surface of a substrate support on which the substrate is supported during the film growing step.

12. The process of claim 1, wherein the film growing step is carried out in an ECR reactor, TCP reactor, parallel plate reactor, helicon, helical resonator, inductively-coupled plasma, or high-density plasma reactor.

13. The process of claim 1, further comprising clamping the substrate on an electrostatic or mechanical chuck during the film growing step.

14. The process of claim 1, wherein helium gas is supplied to a space between a lower surface of the substrate and an upper surface of the chuck.

15. The process of claim 1, further comprising plasma phase reacting an oxygen-containing gas in the gaps and removing polymer residues in the gaps prior to the film growing step.

16. The process of claim 1, wherein a fluorine-containing reactant is introduced into the process chamber and the $SiO_x$ film comprises a fluorinated oxide film.

* * * * *